(12) United States Patent
Kim

(10) Patent No.: US 10,599,338 B2
(45) Date of Patent: Mar. 24, 2020

(54) DATA CONTROL CIRCUIT, AND SEMICONDUCTOR MEMORY APPARATUS AND SEMICONDUCTOR SYSTEM INCLUDING THE SAME

(71) Applicant: SK hynix Inc., Icheon-si Gyeonggi-do (KR)

(72) Inventor: Hyun Seung Kim, Icheon-si (KR)

(73) Assignee: SK hynix Inc., Icheon-si, Gyeonggi-Do (KR)

( * ) Notice: Subject to any disclaimer, the term of this patent is extended or adjusted under 35 U.S.C. 154(b) by 33 days.

(21) Appl. No.: 15/918,536

(22) Filed: Mar. 12, 2018

(65) Prior Publication Data

US 2019/0079672 A1 Mar. 14, 2019

(30) Foreign Application Priority Data

Sep. 8, 2017 (KR) .......................... 10-2017-0115194

(51) Int. Cl.
*G06F 3/06* (2006.01)
*G11C 7/10* (2006.01)
*G11C 29/46* (2006.01)

(52) U.S. Cl.
CPC ............ *G06F 3/061* (2013.01); *G06F 3/0655* (2013.01); *G06F 3/0679* (2013.01); *G11C 7/1006* (2013.01); *G11C 7/1009* (2013.01); *G11C 29/46* (2013.01)

(58) Field of Classification Search
None
See application file for complete search history.

(56) References Cited

U.S. PATENT DOCUMENTS

| 2005/0127945 A1* | 6/2005 | Park | H03K 19/00346 326/52 |
| 2010/0157696 A1* | 6/2010 | Kwak | G11C 7/02 365/189.011 |
| 2011/0153939 A1* | 6/2011 | Choi | G06F 13/1668 711/118 |
| 2011/0249510 A1* | 10/2011 | Hsueh | G11C 7/1006 365/189.02 |
| 2012/0213011 A1* | 8/2012 | Kwack | G11C 7/1009 365/189.05 |
| 2016/0179377 A1* | 6/2016 | Yoon | G06F 3/061 711/154 |

FOREIGN PATENT DOCUMENTS

| KR | 100933806 B1 | 12/2009 |
| KR | 101688050 B1 | 12/2016 |
| KR | 1020170033594 A | 3/2017 |

\* cited by examiner

*Primary Examiner* — Charles Rones
*Assistant Examiner* — Jonah C Krieger
(74) *Attorney, Agent, or Firm* — William Park & Associates LTD.

(57) ABSTRACT

A semiconductor memory apparatus may include a data control circuit, an input/output circuit block, and a data line repeater block. The data control circuit may generate a data control flag signal based on an operation control signal and data. The input/output circuit block may perform a data bus inversion operation for the data, based on the data control flag signal. The data line repeater block may perform a data masking operation for the data based on the data control flag signal.

16 Claims, 5 Drawing Sheets

DATA CONTROL CIRCUIT, AND SEMICONDUCTOR MEMORY APPARATUS AND SEMICONDUCTOR SYSTEM INCLUDING THE SAME

CROSS-REFERENCES TO RELATED APPLICATION

The present application claims priority under 35 U.S.C. § 119(a) to Korean application number 10-2017-0115194, filed on Sep. 8, 2017, in the Korean Intellectual Property Office, which is incorporated herein by reference in its entirety.

BACKGROUND

1. Technical Field

Various embodiments generally relate to a semiconductor technology, and, more particularly, to a data control circuit, and a semiconductor apparatus and a semiconductor system including the same.

2. Related Art

Electronic systems may consist of a large number of electronic components. Among the electronic systems, a computer system may have many semiconductor apparatuses, which are electronic components that exploit electronic properties of semiconductor materials. The semiconductor apparatuses which configure the computer system may communicate by performing data input/output operations.

The semiconductor memory apparatus includes a memory bank region where a plurality of memory cells are disposed.

SUMMARY

Various embodiments are directed to a semiconductor apparatus and a semiconductor system including an integrated data control circuit capable of controlling a data bus inversion operation and a data masking operation.

In an embodiment, a semiconductor memory apparatus may include: a data control circuit configured to generate a data control flag signal based on an operation control signal and data; an input/output circuit block configured to invert or not-invert the data based on the data control flag signal, and output an output; and a data line repeater block configured to selectively output the data based on the data control flag signal.

In an embodiment, a semiconductor memory apparatus may include: a data control circuit configured to generate a data control flag signal based on an operation control signal such that one of a data bus inversion operation for read data and a data masking operation for write data is performed; an input/output circuit block configured to invert or not-invert the read data transmitted through a data transmission line based on the data control flag signal, and output an output; and a data line repeater block configured to selectively output the write data transmitted through the data transmission line to a memory bank region based on the data control flag signal.

DETAILED DESCRIPTION

Hereinafter, a data control circuit, and a semiconductor apparatus and a semiconductor system including the same will be described below with reference to the accompanying drawings through various examples of embodiments.

Figure 1:
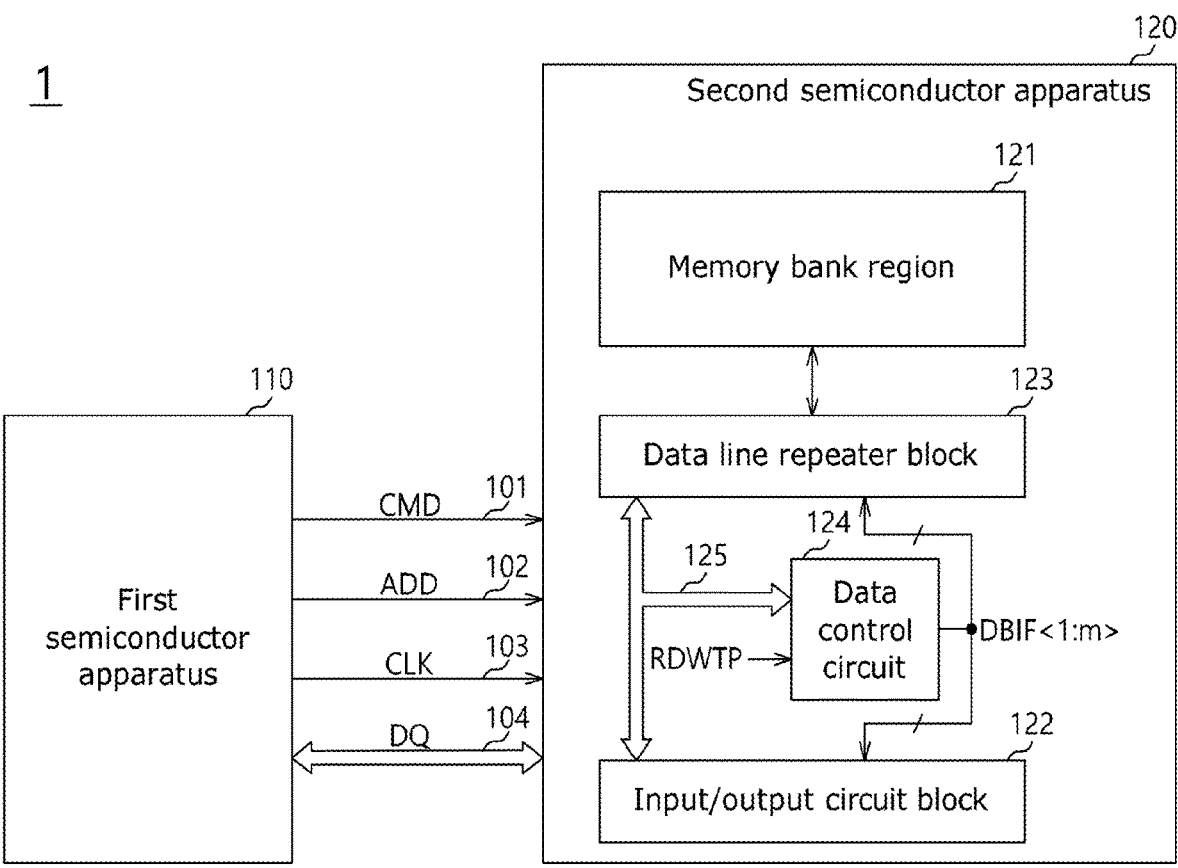
FIG. 1 is a diagram illustrating a representation of an example configuration of a semiconductor system in accordance with an embodiment.

FIG. 1 is a diagram illustrating a representation of an example configuration of a semiconductor system 1 in accordance with an embodiment. In FIG. 1, the semiconductor system 1 may include a first semiconductor apparatus 110 and a second semiconductor apparatus 120. The first semiconductor apparatus 110 and the second semiconductor apparatus 120 may be electronic components which communicate with each other. In an embodiment, the first semiconductor apparatus 110 may be a master apparatus, and the second semiconductor apparatus 120 may be a slave apparatus which operates by being controlled by the first semiconductor apparatus 110. For example, the first semiconductor apparatus 110 may be a host apparatus such as a processor or a controller, and may include a central processing unit (CPU), a graphic processing unit (GPU), a multimedia processor (MMP), a digital signal processor (DSP), or a memory controller. Further, the first semiconductor apparatus 110 may be realized in the form of a system-on-chip by combining processor chips having various functions, such as application processors (AP). The second semiconductor apparatus 120 may be a memory apparatus, and the memory apparatus may include a volatile memory or a nonvolatile memory. The volatile memory may include an SRAM (static RAM), a DRAM (dynamic RAM), or an SDRAM (synchronous DRAM). The nonvolatile memory may include a ROM (read only memory), a PROM (programmable ROM), an EEPROM (electrically erasable and programmable ROM), an EPROM (electrically programmable ROM), a flash memory, a PRAM (phase change RAM), an MRAM (magnetic RAM), an RRAM (resistive RAM) or an FRAM (ferroelectric RAM).

The first semiconductor apparatus 110 may provide various control signals to control the second semiconductor apparatus 120 and thereby perform data communications. For example, the first semiconductor apparatus 110 may be coupled with the second semiconductor apparatus 120 through a command bus 101, an address bus 102, a clock bus 103, and a data bus 104. The command bus 101 may be a unidirectional signal transmission line for transmitting a command signal CMD. The address bus 102 may be a unidirectional signal transmission line for transmitting an address signal ADD. The clock bus 103 may be a unidirectional signal transmission line for transmitting a clock signal CLK. In an embodiment, the clock signal CLK may be plural and include a system clock signal and a data clock signal. The data clock signal may be a clock signal which is used to transmit data through synchronization, and the system clock signal may be a signal which is used to transmit remaining control signals except data. The data bus 104 may be a bidirectional signal transmission line for transmitting data DQ. An operation in which data is transmitted from the first semiconductor apparatus 110 to the second semiconductor apparatus 120 and is stored in the second semiconductor apparatus 120 may be a data input operation and/or a write operation, and an operation in which data stored in the second semiconductor apparatus 120 is transmitted from the second semiconductor apparatus 120 to the first semiconductor apparatus 110 may be a data output operation and/or a read operation. In order to perform the write operation, the first semiconductor apparatus 110 may provide the command signal CMD, the address signal ADD, and the data DQ to the second semiconductor apparatus 120. In order to perform the read operation, the first semiconductor apparatus 110 may provide the command signal CMD and the address signal ADD to the second semiconductor apparatus 120, and the second semiconductor apparatus 120 may provide the data DQ to the first semiconductor apparatus 110.

In FIG. 1, the second semiconductor apparatus 120 may include a memory bank region 121, an input/output circuit block 122, a data line repeater block 123, and a data control circuit 124. The memory bank region 121 may be a core region, and may include a plurality of memory cells capable of storing data. A plurality of bit lines and a plurality of word lines may be disposed in the memory bank region 121, and memory cells may be coupled to points where the plurality of bit lines and the plurality of word lines intersect with each other. The memory bank region 121 may include various core control circuits for storing data in memory cells or outputting data stored in the memory cells. The input/output circuit block 122 may be coupled with the first semiconductor apparatus 110 through the data bus 104. The input/output circuit block 122 may be coupled with the memory bank region 121 through data transmission lines 125. The input/output circuit block 122 may output data transmitted from the first semiconductor apparatus 110, to the data transmission lines 125 in a write operation, and may output data transmitted through the data transmission lines 125, to the first semiconductor apparatus 110 in a read operation. Hereinbelow, data transmitted from the first semiconductor apparatus 110 and transmitted through the data transmission lines 125 in the write operation may be referred to as write data, and data outputted from the memory bank region 121 and transmitted through the data transmission lines 125 in the read operation may be referred to as read data. The input/output circuit block 122 may perform a data bus inversion operation in the read operation. The input/output circuit block 122 may perform the data bus inversion operation for the read data in the read operation, based on data control flag signals DBIF<1:m> (m is an integer of 2 or more).

The data line repeater block 123 may be coupled between the data transmission lines 125 and the memory bank region 121. The data line repeater block 123 may drive or repeat write data transmitted through the input/output circuit block 122 and the data transmission lines 125, and may provide the write data to the memory bank region 121. The data line repeater block 123 may drive or repeat data outputted from the memory bank region 121 and may output the data to the data transmission lines 125. That is to say, the data line repeater block 123 may drive the data transmission lines 125 based on the data outputted from the memory bank region 121. The data line repeater block 123 may perform a data masking operation in the write operation. The data line repeater block 123 may perform the data masking operation for the write data based on the data control flag signals DBIF<1:m>.

The data control circuit 124 may be coupled with the data transmission lines 125, and may receive data transmitted through the data transmission lines 125. The data control circuit 124 may generate the data control flag signals DBIF<1:m> based on an operation control signal RDWTP and the received data. The operation control signal RDWTP may include information on whether the second semiconductor apparatus 120 performs a write operation or a read operation. The operation control signal RDWTP may be generated based on the command signal CMD. For example, the operation control signal RDWTP may be enabled based on a read command signal in the read operation, and may be disabled based on a write command signal in the write operation. The data control circuit 124 may generate the data control flag signals DBIF<1:m> such that one of the data bus inversion operation and the data masking operation may be performed. The data control circuit 124 may generate the data control flag signals DBIF<1:m> such that the data bus inversion operation is performed for the read data in the read operation, and may generate the data control flag signals DBIF<1:m> such that the data masking operation is performed for the write data in the write operation. The data control circuit 124 may be an integrated logic circuit for the data bus inversion operation and the data masking operation. The data control flag signals DBIF<1:m> may be provided in common to the input/output circuit block 122 and the data line repeater block 123. Therefore, the semiconductor memory apparatus in accordance with an embodiment may increase design efficiency and sufficiently secure a circuit area. The data control circuit 124 may generate the data control flag signals DBIF<1:m> by determining the levels of all the bits of the data transmitted through the data transmission lines 125 in the read operation. The data control circuit 124 may generate the data control flag signals DBIF<1:m> by determining levels of some bits of the data transmitted through the data transmission lines 125 in the write operation.

Figure 2:
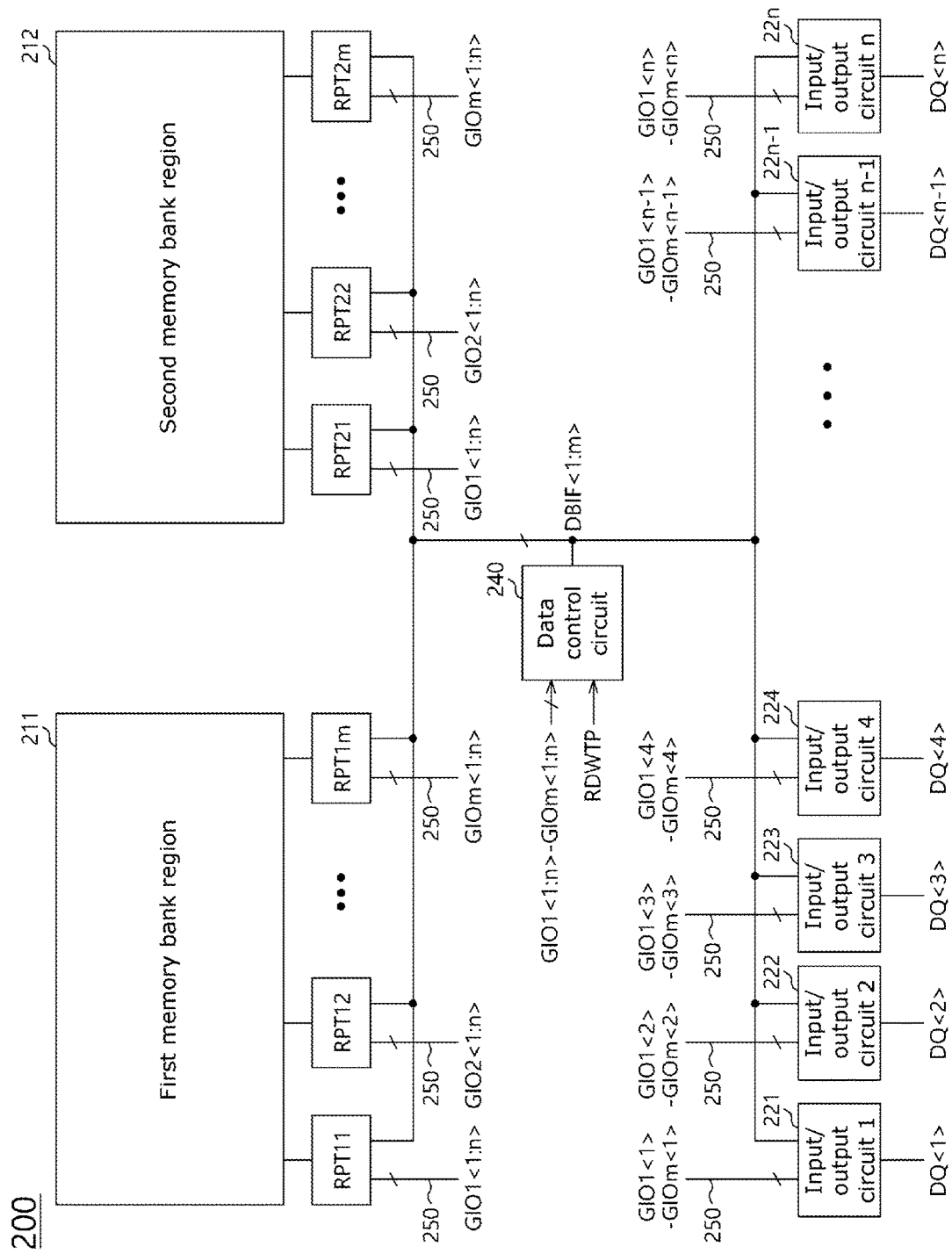
FIG. 2 is a diagram illustrating a representation of an example configuration of a semiconductor memory apparatus in accordance with an embodiment.

FIG. 2 is a diagram illustrating a representation of an example configuration of a semiconductor memory apparatus 200 in accordance with an embodiment. The semiconductor memory apparatus 200 shown in FIG. 2 may be applied as the second semiconductor apparatus 120 shown in FIG. 1. In FIG. 2, the semiconductor memory apparatus 200 may include a memory bank region, an input/output circuit block, a data line repeater block, and a data control circuit 240. The memory bank region may include a first memory bank region 211 and a second memory bank region 212. While it is illustrated in FIG. 2 that the semiconductor memory apparatus 200 includes two memory bank regions, it is not intended that that embodiment be limited thereto. The semiconductor memory apparatus 200 may include at least two memory bank regions where there may be an even number of memory bank regions. In an embodiment, the semiconductor memory apparatus 200 may operate in a first byte mode and a second byte mode. The first byte mode may be, for example, an X16 operation mode, and may be an operation mode in which successive input/output of 16-bit data is possible. The second byte mode may be, for example, an X8 operation mode, and may be an operation mode in which successive input/output of 8-bit data is possible. In the second byte mode, any one of the first and second memory bank regions 211 and 212 may selectively perform data input/output operations. FIG. 2 shows components of the semiconductor memory apparatus 200 for operating in the second byte mode.

The input/output circuit block may include a plurality of input/output circuits 221, 222, 223, 224, . . . , 22n-1, and 22n. The plurality of input/output circuits 221, 222, 223, 224, . . . , 22n-1, and 22n may be coupled between data buses DQ<1:n> (n is an integer of 2 or more) and coupled with an external apparatus such as the first semiconductor apparatus 110 shown in FIG. 1 and data transmission lines 250. The plurality of input/output circuits 221, 222, 223, 224, . . . , 22n-1, and 22n may receive data through the data buses DQ<1:n> or output data to the data buses DQ<1:n>. The plurality of input/output circuits 221, 222, 223, 224, . . . , 22n-1, and 22n may parallelize data received through the data buses DQ<1:n> and output the parallelized data to the data transmission lines 250. The plurality of input/output circuits 221, 222, 223, 224, . . . , 22n-1, and 22n may serialize data received through the data transmission lines 250 and output the serialized data to the data buses DQ<1: n>. Each of the plurality of input/output circuits 221, 222, 223, 224, . . . , 22n-1, and 22n may include a parallelizer and a serializer for parallelizing and serializing received data. The plurality of input/output circuits 221, 222, 223, 224, . . . , 22n-1, and 22n may perform a data bus inversion operation for read data. The plurality of input/output circuits 221, 222, 223, 224, . . . , 22n-1, and 22n may invert or not-invert the read data received through the data transmission lines 250 based on data control flag signals DBIF<1: m>, and may output the inverted or not-inverted read data to the data buses DQ<1:n>. The plurality of input/output circuits 221, 222, 223, 224, . . . , 22n-1, and 22n may include read multiplexers for inverting or not-inverting the data received through the data transmission lines 250, and outputting the inverted or not-inverted data based on the data control flag signals DBIF<1:m>. Descriptions will be made later for the read multiplexers.

The data line repeater block may include a plurality of repeaters RPT11, RPT12, . . . , RPT1m, RPT21, RPT22, . . . and RPT2m. The plurality of repeaters RPT11, RPT12, . . . , RPT1m, RPT21, RPT22, . . . and RPT2m may be coupled between the first and second memory bank regions 211 and 212 and the data transmission lines 250. The plurality of repeaters RPT11, RPT12, . . . , RPT1m, RPT21, RPT22, . . . and RPT2m may drive and/or repeat data received through the data transmission lines 250, and may provide the repeated data to the first and second memory bank regions 211 and 212. The plurality of repeaters RPT11, RPT12, . . . , RPT1m, RPT21, RPT22, . . . and RPT2m may drive and/or repeat data outputted from the first and second memory bank regions 211 and 212, and may output the repeated data to the data transmission lines 250. The plurality of repeaters RPT11, RPT12, . . . , RPT1m, RPT21, RPT22, . . . and RPT2m may include write drivers for repeating data received through the data transmission lines 250 and read drivers for repeating data outputted from the first and second memory bank regions 211 and 212. The plurality of repeaters RPT11, RPT12, . . . , RPT1m, RPT21, RPT22, . . . and RPT2m may perform a data masking operation for write data. The plurality of repeaters RPT11, RPT12, . . . , RPT1m, RPT21, RPT22 . . . and RPT2m may provide the write data received is through the data transmission lines 250, selectively to the first and second memory bank regions 211 and 212 based on the data control flag signals DBIF<1:m>. For example, when performing a data masking operation, the plurality of repeaters RPT11, RPT12, . . . , RPT1m, RPT21, RPT22, . . . and RPT2m may block write data received through the data transmission lines 250 from being outputted to the first and second memory bank regions 121 and 122 when the data masking signal DM is enabled. In one example, the plurality of repeaters RPT11, RPT12, . . . , RPT1m, RPT21, RPT22 . . . and RPT2m may output data received through the data transmission lines 250 to the first and second memory bank regions 211 and 212 when the data masking signal is disabled. The plurality of repeaters RPT11, RPT12, . . . , RPT1m, RPT21, RPT22, . . . and RPT2m may include write multiplexers which generate a data masking signal based on the data control flag signals DBIF<1:m> such that data received through the data transmission lines 250 may be selectively outputted. Descriptions will be made later for the write multiplexers.

In FIG. 2, the semiconductor memory apparatus 200 may operate in, for example, the second byte mode, and one of the first and second memory bank regions 211 and 212 may selectively perform a write operation and a read operation according to control of the external apparatus such as the first semiconductor apparatus 110 shown in FIG. 1. For example, the semiconductor memory apparatus 200 may be coupled with n number of data buses, and may operate with the burst length of m. A number, such as m*n, of data transmission lines 250 may be provided. In FIG. 2, the plurality of input/output circuits 221, 222, 223, 224, . . . , 22n-1, and 22n and the plurality of repeaters RPT11, RPT12, . . . , RPT1m, RPT21, RPT22, . . . and RPT2m may be coupled with each other by the data transmission lines 250. For the sake of clarity in explanation, in FIG. 2, data to be inputted/outputted by the plurality of input/output circuits 221, 222, 223, 224, . . . , 22n-1, and 22n and data to be inputted/outputted by the plurality of repeaters RPT11, RPT12, . . . , RPT1m, RPT21, RPT22, . . . and RPT2m are separately represented. The first input/output circuit 221 may input/output first data GIO1<1> to GIOm<1> of first to m^th burst lengths, and the second input/output circuit 222 may input/output second data GIO1<2> to GIOm<2> of the first to m^th burst lengths. The third input/output circuit 223 may input/output third data GIO1<3> to GIOm<3> of the first to m^th burst lengths, and the fourth input/output circuit 224 may input/output fourth data GIO1<4> to GIOm<4> of the first to m^th burst lengths. The (n-1)^th input/output circuit 22n-1 may input/output (n-1)^th data GIO1<n-1> to GIOm<n-1> of the first to m^th burst lengths, and the n^th input/output circuit 22n may input/output n^th data GIO1<n> to GIOm<n> of the first to m^th burst lengths. Each of the first repeater RPT11 coupled with the first memory bank region 211 and the first repeater RPT21 coupled with the second memory bank region 212 may input/output the first to n^th data GIO1<1:n> of the first burst length. Each of the second repeater RPT12 coupled with the first memory bank region 211 and the second repeater RPT22 coupled with the second memory bank region 212 may input/output the first to n^th data GIO2<1:n> of the second burst length. Each of the m^th repeater RPT1m coupled with the first memory bank region 211 and the m^th repeater RPT2m coupled with the second memory bank region 212 may input/output the first to n^th data GIOm<1: n> of the m^th burst length.

The data control circuit 240 may receive both an operation control signal RDWTP and the data GIO1<1:n> to GIOm<1:n> transmitted through the data transmission lines 250. The data control circuit 240 may generate the data control flag signals DBIF<1:m> based on the operation control signal RDWTP such that one of the data bus inversion operation and the data masking operation may be performed. The data control circuit 240 may generate the data control flag signals DBIF<1:m> for a data bus inversion operation based on the operation control signal RDWTP which is enabled in the read operation, and may generate the data control flag signals DBIF<1:m> for a data masking operation based on the operation control signal RDWTP which is disabled in the write operation. The data control circuit 240 may generate each of the data control flag signals DBIF<1:m> by determining the levels of a plurality of data for configuring one burst length. The data control flag signals DBIF<1:m> may have the number of bits corresponding to the burst length. The data control circuit 240 may generate each of the data control flag signals DBIF<1:m> by determining the levels of all the data bits of one burst length in the read operation. For example, the data control circuit 240 may enable each of the data control flag signals DBIF<1:m> when the number of bits having a predetermined level among data configuring one burst length is a majority, and may disable each of the data control flag signals DBIF<1:m> when the number is not a majority. The data control circuit 240 may generate each of the data control flag signals DBIF<1:m> by determining the levels of some data bits of one burst length in the write operation. For example, the data control circuit 240 may enable each of the data control flag signals DBIF<1:m> when the number of bits having a predetermined level among some data bits of one burst length is greater than or equal to a predetermined number, and may disable each of the data control flag signals DBIF<1:m> when the number is less than the predetermined number.

The plurality of input/output circuits 221, 222, 223, 224, . . . , 22n-1 and 22n may invert the data GIO1<1> to GIOm<n> based on the data control flag signals DBIF<1:m> which are enabled, and may output the inverted data to the data buses DQ<1:n>. The plurality of input/output circuits 221, 222, 223, 224, . . . , 22n-1, and 22n may not-invert the data GIO1<1> to GIOm<n> based on the data control flag signals DBIF<1:m> which are disabled, and may output the not-inverted data to the data buses DQ<1:n>. In order to provide notification of whether the data GIO1<1> to GIOm<n> transmitted through the data transmission lines 250 are inverted by the plurality of input/output circuits 221, 222, 223, 224, . . . , 22n-1 and 22n and thus the inverted data are outputted to the data buses DQ<1:n> or are not-inverted and thus the not-inverted data are outputted to the data buses DQ<1:n>, the data control flag signals DBIF<1:m> may be outputted to the external apparatus through separate pads and buses.

The plurality of repeaters RPT11, RPT12, . . . , RPT1m, RPT21, RPT22, . . . and RPT2m may enable the data masking signal based on the data control flag signals DBIF<1:m> which are enabled to block the data GIO1<1:n> to GIOm<1:n> from being outputted to the first and second memory bank regions 211 and 212. The plurality of repeaters RPT11, RPT12, . . . , RPT1m, RPT21, RPT22 . . . and RPT2m may disable the data masking signal based on the data control flag signals DBIF<1:m> which are disabled to output the data GIO1<1:n> to GIOm<1:n> to the first and second memory bank regions 211 and 212.

Figure 3:
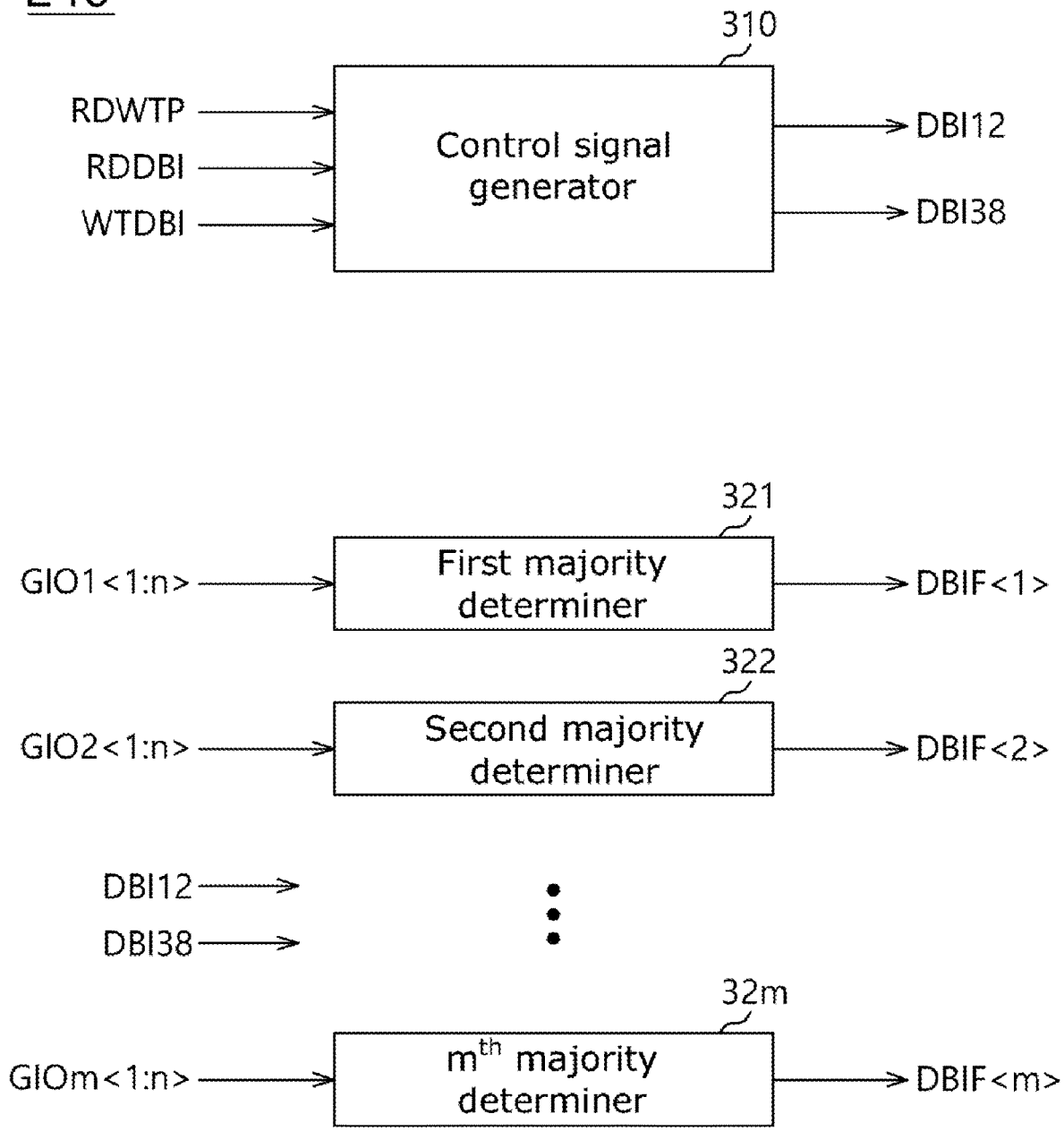
FIG. 3 is a diagram illustrating a representation of an example configuration of the data control circuit shown in FIG. 2.

FIG. 3 is a diagram illustrating a representation of an example configuration of the data control circuit 240 shown in FIG. 2. In FIG. 3, the data control circuit 240 may include a control signal generator 310 and a plurality of majority determiners 321, 322, . . . and 32m. The control signal generator 310 may generate a first bit select signal DBI12 and a second bit select signal DBI38 based on the operation control signal RDWTP and operation setting signals RDDBI and WTDBI. The operation setting signals RDDBI and WTDBI generated based on the operation setting information of the semiconductor memory apparatus 200 may be signals generated from, for example, a mode register set which stores information based on a command signal (CMD). The operation setting signals RDDBI and WTDBI may include a data bus inversion setting signal RDDBI which indicates whether to perform a data bus inversion operation in a read operation, and a data masking setting signal WTDBI which indicates whether to perform a data masking operation in a write operation. When the data bus inversion setting signal RDDBI is enabled, the data control circuit 240 may generate the data control flag signals DBIF<1:m> for a data bus inversion operation. When the data masking setting signal WTDBI is enabled, the data control circuit 240 may generate the data control flag signals DBIF<1:m> for the data masking operation. The control signal generator 310 may enable both the first and second bit select signals DBI12 and DBI38 when the operation control signal RDWTP and the data bus inversion setting signal RDDBI are a state in which they are enabled. The control signal generator 310 may disable the first bit select signal DBI12 and enable the second bit select signal DBI38 when the operation control signal RDWTP is disabled and the data masking setting signal WTDBI is enabled.

The plurality of majority determiners 321, 322, . . . and 32m may receive the data GIO1<1:n>, GIO2<1:n>, . . . and GIOm<1:n>, respectively, of the allocated burst lengths and the first and second bit select signals DBI12 and DBI38. The plurality of majority determiners 321, 322, . . . and 32m may generate the data control flag signals DBIF<1:m> by determining levels of all the bits or some bits of the data GIO1<1:n>, GIO2<1:n>, . . . and GIOm<1:n>, respectively, of the allocated burst lengths, based on the first and second bit select signals DBI12 and DBI38. The first bit select signal DBI12 may be for selecting partial bits of data received by the plurality of majority determiners 321, 322, . . . and 32m, and the second bit select signal DBI38 may be for selecting the remaining bits of data received by the plurality of majority determiners 321, 322, . . . and 32m. For example, when one burst length is configured by eight data bits, that is, when n is 8, the first bit select signal DBI12 may be a signal which selects first and second bits among the eight data bits, and the second bit select signal DBI38 may be a signal which selects third to eighth bits among the eight data bits. However, the number of bits to be selected by the first and second bit select signals DBI12 and DBI38 may be changed variously. The first majority determiner 321 may receive data GIO1<1:n> of the first burst length, and may generate a data control flag signal DBIF<1> by determining levels of all the bits of the data GIO1<1:n> of the first burst length when both the first and second bit select signals DBI12 and DBI38 are enabled. For example, the first majority determiner 321 may enable the data control flag signal DBIF<1> when a majority of the first to eighth bits have a high level, and may disable the data control flag signal DBIF<1> when a majority of the first to eighth bits have a low level. The first majority determiner 321 may receive data GIO1<1:n> of the first burst length, and may generate the data control flag signal DBIF<1> by determining levels of some bits of the data GIO1<1:n> is of the first burst length when the first bit select signal DBI12 is disabled and the second bit select signal DBI38 is enabled. For example, the first majority determiner 321 may determine levels of the third to eighth bits of data, may enable the data control flag signal DBIF<1> when the number of data bits having a high level among the third to eighth bits of the data is greater than or equal to the predetermined number, and may disable the data control flag signal DBIF<1> when the number of data bits having a high level among the third to eighth data bits is less than the predetermined number. The second to m^th majority determiners 322, . . . and 32m may receive the data GIO2<1:n>, . . . and GIOm<1:n>, respectively, of the allocated burst lengths, and may generate the data control flag signals DBIF<2:m> by determining levels of all the bits or some bits of the received data GIO2<1:n>, . . . and GIOm<1:n>, based on the first and second bit select signals DBI12 and DBI38.

Figure 4:
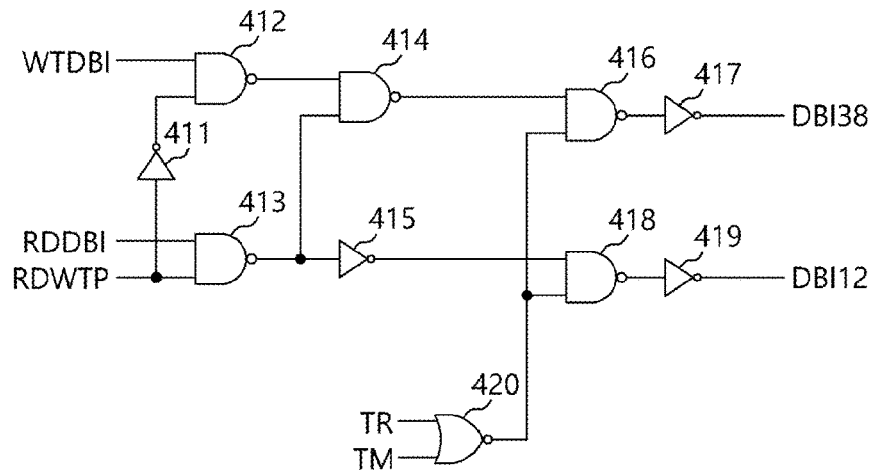
FIG. 4 is a diagram illustrating a representation of an example configuration of the control signal generator shown in FIG. 3.

FIG. 4 is a diagram illustrating a representation of an example configuration of the control signal generator 310 shown in FIG. 3. In FIG. 4, the control signal generator 310 may include a first inverter 411, a first NAND gate 412, a second NAND gate 413, a third NAND gate 414, a second inverter 415, a fourth NAND gate 416, a third inverter 417, a fifth NAND gate 418, a fourth inverter 419, and a NOR gate 420. The first inverter 411 may receive the operation control signal RDWTP, invert the operation control signal RDWTP, and output the inverted operation control signal RDWTP. The first NAND gate 412 may receive the inverted operation control signal RDWTP and the data masking setting signal WTDBI. The second NAND gate 413 may receive the operation control signal RDWTP and the data bus inversion setting signal RDDBI. The third NAND gate 414 may receive and perform a NAND operation on the outputs of the first and second NAND gates 412 and 413. The second inverter 415 may invert the output of the second NAND gate 413 and output the inverted output. The fourth NAND gate 416 may receive the outputs of the third NAND gate 414 and the NOR gate 420, and the third inverter 417 may invert the output of the fourth NAND gate 416 and generate the second bit select signal DBI38. The fifth NAND gate 418 may receive the output of the second inverter 415 and the NOR gate 420, and the fourth inverter 419 may invert the output of the fifth NAND gate 418 and generate the first bit select signal DBI12. The NOR gate 420 may receive a training signal TR and a test mode signal TM. The semiconductor memory apparatus 200 might not perform a data bus inversion operation and the data masking operation during a training operation and a test operation. The NOR gate 420 may generate an output signal of a low level when even one of the training signal TR and the test mode signal TM is enabled, and may thereby disable the first and second bit select signals DBI12 and DBI38 to low levels. When the semiconductor memory apparatus 200 does not perform the training operation or the test operation but a normal operation, the training signal TR and the test mode signal TM may be disabled, and the NOR gate 420 may output a signal of a high level. If the data bus inversion setting signal RDDBI is enabled to a high level and the operation control signal RDWTP is enabled to a high level, the fourth and fifth NAND gates 416 and 418 receive signals of high levels, and both the first and second bit select signals DBI12 and DBI38 may be enabled to high levels. If the data masking setting signal WTDBI is enabled to a high level and the operation control signal RDWTP is disabled to a low level, the fourth NAND gate 416 may receive a signal of the high level, but the fifth NAND gate 418 may receive a signal of a low level. Therefore, the first bit select signal DBI12 may be disabled to the low level, and the second bit select signal DBI38 may be enabled to the high level.

Figure 5:
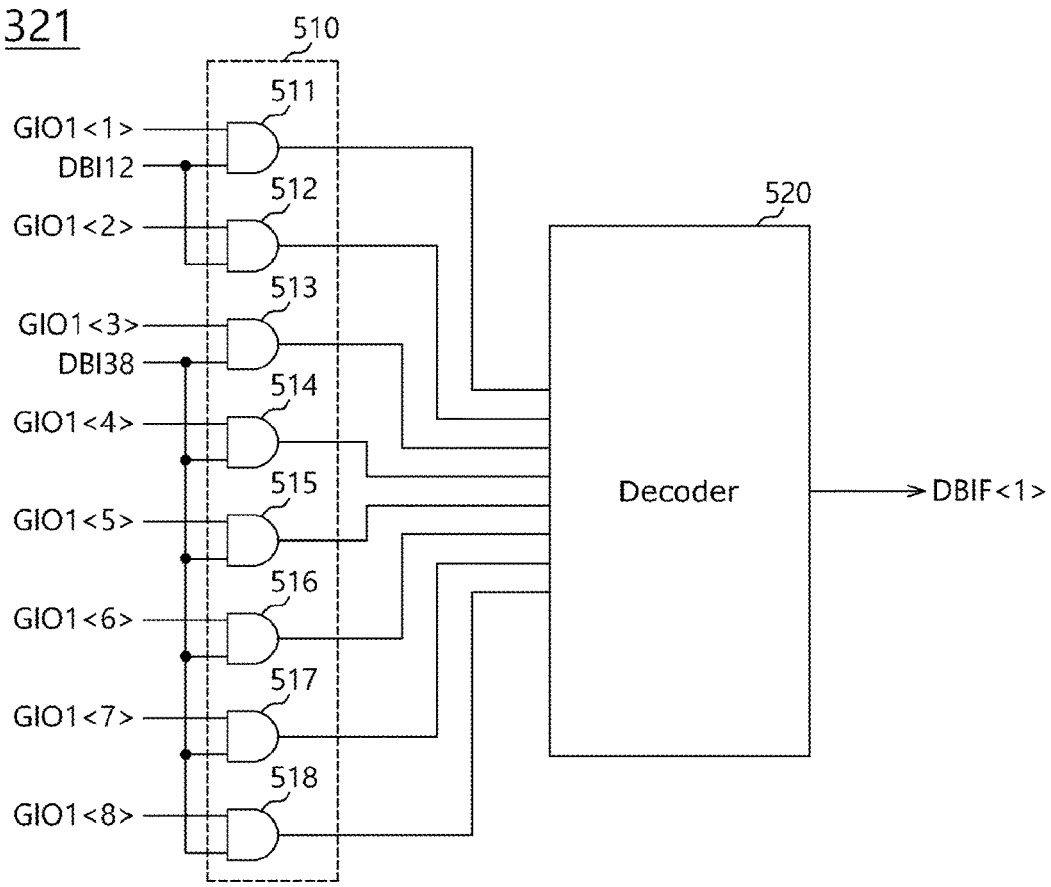
FIG. 5 is a diagram illustrating a representation of an example configuration of the first majority determiner shown in FIG. 3.

FIG. 5 is a diagram illustrating an example configuration of the first majority determiner 321 shown in FIG. 3. The second to m^th majority determiners 322, . . . and 32m shown in FIG. 3 may have substantially the same configuration as the first majority determiner 321 except for the data received therein. The first majority determiner 321 may include a data bit selector 510 and a decoder 520. The data bit selector 510 may receive the data GIO1<1:8> of the first burst length and the first and second bit select signals DBI12 and DBI38. The data bit selector 510 may include a plurality of AND gates. When data configuring of one burst length is eight, the data bit selector 510 may include eight AND gates. First and second AND gates 511 and 512 may receive allocated data GIO1<1:2>, respectively, and the first bit select signal DBI12. The first and second AND gates 511 and 512 may output the allocated data GIO1<1:2>, respectively, when the first bit select signal DBI12 is enabled, and may block the allocated data GIO1<1:2>, respectively, from being outputted when the first bit select signal DBI12 is disabled. Third to eighth AND gates 513, 514, 515, 516, 517, and 518 may receive allocated data GIO1<3:8>, respectively, and the second bit select signal DBI38. The third to eighth AND gates 513, 514, 515, 516, 517 and 518 may output the allocated data GIO1<3:8>, respectively, when the second bit select signal DBI38 is enabled, and may block the allocated data GIO1<3:8>, respectively, from being outputted when the second bit select signal DBI38 is disabled. Thus, the data bit selector 510 may output all bits of received data GIO1<1:8> when both the first and second bit select signals DBI12 and DBI38 are enabled. Further, the data bit selector 510 may output some of the received data bits when the first bit select signal DBI12 is disabled and the second bit select signal is enabled.

The decoder 520 may receive and decode the outputs of the data bit selector 510. The decoder 520 may enable the data control flag signal DBIF<1> when the majority of bits has the predetermined level among the outputs of the data bit selector 510 in a read operation, and may disable the data control flag signal DBIF<1> when the number of bits is not a majority. The decoder 520 may enable the data control flag signal DBIF<1> when the number of bits having the predetermined level among the outputs of the data bit selector 510 in the write operation is greater than or equal to the predetermined number, and may disable the data control flag signal DBIF<1> when the number of bits is less than the predetermined number. For example, the decoder 520 may enable the data control flag signal DBIF<1> when at least five bits among the outputs of the data bit selector 510 are a logic high level, and may disable the data control flag signal DBIF<1> when at most four bits among the outputs of the data bit selector 510 are the logic high level.

Figure 6:
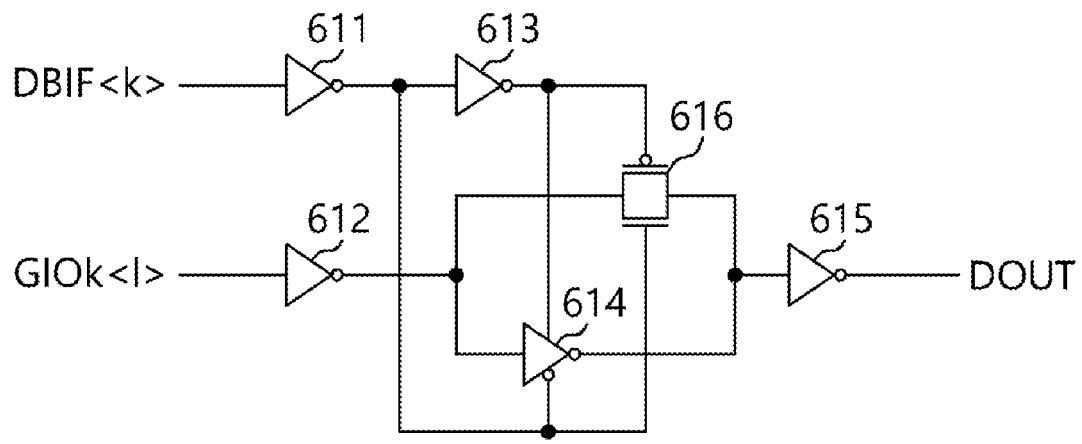
FIG. 6 is a diagram illustrating a representation of an example configuration of a read multiplexer in accordance with an embodiment.

FIG. 6 is a diagram illustrating a representation of an example configuration of a read multiplexer 600 in accordance with an embodiment. The read multiplexer 600 may be applied as a portion of the plurality of input/output circuits 221, 222, 223, 224, . . . , 22n-1, and 22n shown in FIG. 2. The read multiplexer 600 may include first to fifth inverters 611, 612, 613, 614, and 615 and a pass gate 616. The first inverter 611 may invert an allocated data control flag signal DBIF<k> (k is an integer between 1 and m) and output or provide an output. The second inverter 612 may invert allocated data GIOk<l> (l is an integer between 1 and n) and provide an output. The third inverter 613 may invert the output of the first inverter 611 and provide an output. The fourth inverter 614 may be a tri-state inverter having a PMOS terminal controlled by the output of the first inverter 611 and an NMOS terminal is controlled by the output of the third inverter 613. The fourth inverter 614 may invert the output of the second inverter 612 and provide an output, by being turned on when the allocated data control flag signal DBIF<k> is enabled to a high level. The pass gate 616 may be controlled by the output of the third inverter 613 in the PMOS terminal thereof and may be controlled by the output of the first inverter 611 in the NMOS terminal thereof. The pass gate 616 may output the output of the second inverter 612 by being turned on when the allocated data control flag signal DBIF<k> is disabled to a low level. The fifth inverter 615 may be coupled in common with the pass gate 616 and the output terminal of the fourth inverter 614. Further, the fifth inverter 615 invert the output of the pass gate 616 or the fourth inverter 614, and generate an output signal DOUT. Therefore, the read multiplexer 600 may invert the allocated data GIOk<I> and output the inverted data as the output signal DOUT when the allocated data control flag signal DBIF<k> is enabled, and may not-invert the allocated data GIOk<I> and output the not-inverted data as the output signal DOUT when the allocated data control flag signal DBIF<k> is disabled. The inverted and not-inverted data may be output to the data bus 104 (see FIG. 1).

Figure 7:
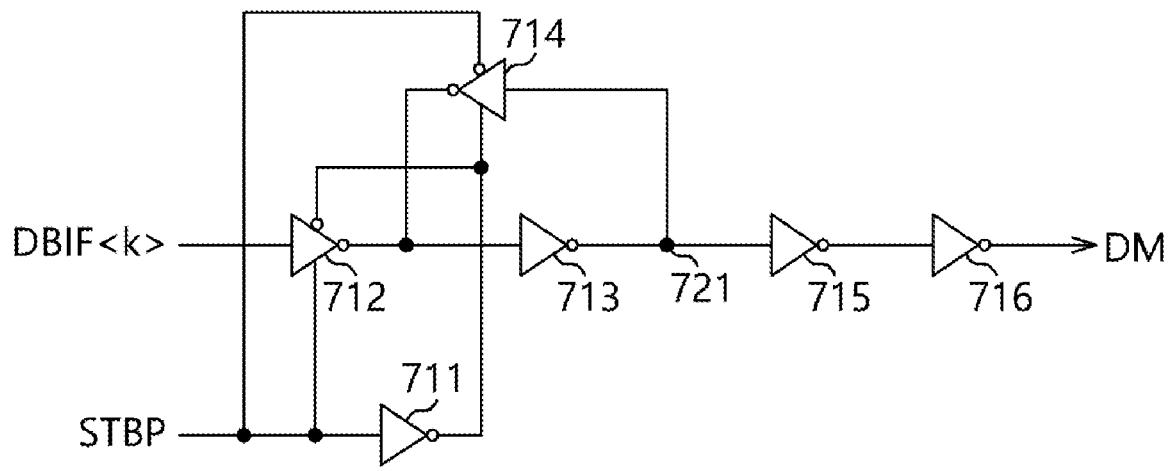
FIG. 7 is a diagram illustrating a representation of an example configuration of a write multiplexer in accordance with an embodiment.

FIG. 7 is a diagram illustrating a representation of an example configuration of a write multiplexer 700 in accordance with an embodiment. The write multiplexer 700 may be applied as a portion of the plurality of repeaters RPT11, RPT12, . . . , RPT1*m*, RPT21, RPT22, . . . and RPT2*m* shown in FIG. 2. The write multiplexer 700 may receive an allocated data control flag signal DBIF<k> and a strobe pulse signal STBP. In FIG. 2, the plurality of repeaters RPT11, RPT12, . . . , RPT1*m*, RPT21, RPT22, . . . and RPT2*m* may drive and/or repeat received data in synchronization with the strobe pulse signal STBP, and may selectively output the repeated data based on the data masking signal DM. The write multiplexer 700 may include first to sixth inverters 711, 712, 713, 714, 715 and 716. The first inverter 711 may invert the strobe pulse signal STBP and provide an output. The second inverter 712 may be a tri-state inverter having a PMOS terminal controlled by the output of the first inverter 711 and an NMOS terminal is controlled by the strobe pulse signal STBP. The second inverter 712 may invert the allocated data control flag signal DBIF<k> and provide an output, when the strobe pulse signal STBP is enabled to a high level. The third inverter 713 may invert the output of the second inverter 712 and drive a node 721. The fourth inverter 714 may be a tri-state inverter having a PMOS terminal controlled by the strobe pulse signal STBP and an NMOS terminal controlled by the output of the first inverter 711. The fourth inverter 714 may latch the voltage level of the node 721 together with the third inverter 713 when the strobe pulse signal STBP is disabled to a low level. The fifth and sixth inverters 715 and 716 may sequentially invert the voltage level of the node 721 and generate the data masking signal DM. Therefore, the write multiplexer 700 may generate the data masking signal DM based on the allocated data control flag signal DBIF<k> when the strobe pulse signal STBP is enabled, and may retain the level of the data masking signal DM when the strobe pulse signal STBP is disabled. In other words, the write multiplexer 700 may enable the data masking signal DM when the data control flag signal DBIF<k> is in an enabled state, and may disable the data masking signal DM when the data control flag signal DBIF<k> is in a disabled state. Thus, in FIG. 2, the plurality of repeaters RPT11, RPT12, . . . , RPT1*m*, RPT21, RPT22, . . . and RPT2*m* may receive the data masking signal DM, and may output the data GIO1<1:n> to GIOm<1:n> received through the data transmission lines 250, selectively to the first and second memory bank regions 211 and 212.

While various embodiments have been described above, it will be understood to those skilled in the art that the embodiments described are examples only. Accordingly, the data control circuit, and the semiconductor apparatus and the semiconductor system including the same described herein should not be limited based on the described embodiments.

What is claimed is:

1. A semiconductor memory apparatus comprising:
   a control signal generator configured to generate a first bit select signal and a second bit select signal based on an operation control signal and an operation setting signal;
   a majority determiner configured to generate a data control flag signal by determining levels of all bits based on the first and second bit select signals in a read operation, and generate the data control flag signal by determining levels of a portion of bits of data based on the first and second bit select signals in a write operation; and
   an input/output circuit block configured to invert or not-invert the data based on the data control flag signal, and output an output; and
   a data line repeater block configured to selectively output the data based on the data control flag signal.

2. The semiconductor memory apparatus according to claim 1, wherein the majority determiner comprises:
   a data bit selector configured to output all bits of the data when both the first and second bit select signals are enabled, and output the portion of bits of the data when the first bit select signal is disabled and the second bit select signal is enabled; and
   a decoder configured to decode outputs of the data bit selector and generate the data control flag signal.

3. The semiconductor memory apparatus according to claim 1,
   wherein the semiconductor memory apparatus further comprises:
   a memory bank region configured to store the data; and
   a data transmission line configured to transmit the data,
   wherein the input/output circuit block couples the data transmission line and a data bus which is coupled with an external apparatus, and
   wherein the data line repeater block couples the data transmission line and the memory bank region.

4. The semiconductor memory apparatus according to claim 3, wherein the input/output circuit block outputs data received through the data bus, to the data transmission line, or outputs data received through the data transmission line, to the data bus.

5. The semiconductor memory apparatus according to claim 4, wherein the input/output circuit block includes at least one of input/output circuit comprising a read multiplexer which outputs an output by inverting the data when the data control flag signal is in an enabled state and outputs an output by not-inverting the data when the data control flag signal is in a disabled state.

6. The semiconductor memory apparatus according to claim 3, wherein the data line repeater block provides data received through the data transmission line to the memory bank region, or provides data outputted from the memory bank region to the data transmission line.

7. The semiconductor memory apparatus according to claim 6, wherein the data line repeater block includes at least one repeater comprising a write multiplexer which enables a data masking signal when the data control flag signal is in an enabled state and disables the data masking signal when the data control flag signal is in a disabled state.

8. The semiconductor memory apparatus according to claim 7, wherein the data line repeater block includes at least one repeater which blocks data received through the data transmission line from being outputted to the memory bank region when the data masking signal is in an enabled state, and outputs data received through the data transmission line to the memory bank region when the data masking signal is in a disabled state.

9. A semiconductor memory apparatus comprising:
a control signal generator configured to generate a first bit select signal and a second bit select signal whether a read operation or a write operation is performed;
a majority determiner configured to generate the data control flag signal by determining levels of all bits of a read data and a portion of bits of a write data based on the first and second bit select signals;
an input/output circuit block configured to invert or not-invert the read data transmitted through a data transmission line based on the data control flag signal, and output an output; and
a data line repeater block configured to selectively output the write data transmitted through the data transmission line to a memory bank region based on the data control flag signal.

10. The semiconductor memory apparatus according to claim 9, wherein the majority determiner generates the data control flag signal by determining levels of all bits of the read data in the read operation, and generates the data control flag signal by determining levels of a portion of bits of the write data in the write operation.

11. The semiconductor memory apparatus according to claim 9, wherein the majority determiner comprises:
a data bit selector configured to output all bits of the received data when both the first and second bit select signals are enabled, and output the portion of bits of the received data when the first bit select signal is disabled and the second bit select signal is enabled; and
a decoder configured to decode outputs of the data bit selector and generate the data control flag signal.

12. The semiconductor memory apparatus according to claim 9, wherein the input/output circuit block couples a data bus which is coupled with an external apparatus and the data transmission line.

13. The semiconductor memory apparatus according to claim 12, wherein the input/output circuit block includes at least one input/output circuit comprising a read multiplexer which inverts the read data and outputs inverted read data to the data bus when the data control flag signal is in an enabled state and not-inverts the read data and outputs not-inverted read data to the data bus when the data control flag signal is in a disabled state.

14. The semiconductor memory apparatus according to claim 9, wherein the data line repeater block couples the data transmission line and the memory bank region.

15. The semiconductor memory apparatus according to claim 14, wherein the data line repeater block includes at least one repeater comprising a write multiplexer which enables a data masking signal when the data control flag signal is in an enabled state and disables the data masking signal when the data control flag signal is in a disabled state.

16. The semiconductor memory apparatus according to claim 15, wherein the repeater blocks data received through the data transmission line, from being output to the memory bank region, when the data masking signal is in an enabled state, and outputs data received through the data transmission line to the memory bank region when the data masking signal is in a disabled state.

\* \* \* \* \*